(12) United States Patent
Wang et al.

(10) Patent No.: US 10,486,542 B2
(45) Date of Patent: Nov. 26, 2019

(54) BATTERY THERMAL CONDITIONING PUMP CONTROL FOR ELECTRIC VEHICLE

(71) Applicant: FORD GLOBAL TECHNOLOGIES, LLC, Dearborn, MI (US)

(72) Inventors: Xu Wang, Northville, MI (US); Chuan He, Northville, MI (US); Changjian Hu, Dearborn, MI (US); Kenneth Jon Cunningham, Livonia, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 149 days.

(21) Appl. No.: 15/647,551

(22) Filed: Jul. 12, 2017

(65) Prior Publication Data

US 2019/0016230 A1     Jan. 17, 2019

(51) Int. Cl.
    *B60L 11/18*     (2006.01)
    *B60L 1/00*     (2006.01)
    (Continued)

(52) U.S. Cl.
    CPC .......... *B60L 11/1874* (2013.01); *B60L 1/003* (2013.01); *B60L 1/02* (2013.01); *B60L 1/08* (2013.01); *B60L 3/0046* (2013.01); *B60L 58/26* (2019.02); *B60R 16/04* (2013.01); *G01R 31/374* (2019.01); *G05B 13/0275* (2013.01); *H02P 27/08* (2013.01); *B60K 2001/005* (2013.01); *B60L 50/16* (2019.02); *B60L 50/61* (2019.02); *B60L 2240/545* (2013.01); *B60W 2050/0058* (2013.01)

(58) Field of Classification Search
    CPC ........ B60L 11/1874; B60L 1/003; B60L 1/08; B60L 3/0046; B60L 11/1879; B60L 2240/005; G01R 31/374; G05B 13/0275; H02P 27/08; B60K 2001/005; B60R 16/04
    See application file for complete search history.

(56) References Cited

U.S. PATENT DOCUMENTS 7,971,447 B2     7/2011     Maitre
8,781,658 B2     7/2014     Simonini
(Continued)

*Primary Examiner* — Melvin Jones
(74) *Attorney, Agent, or Firm* — David B. Kelley; Brooks Kushman P.C.

(57) ABSTRACT

A hybrid electric vehicle (HEV) and method of operation includes a thermal management system (TMS) that maintains optimal battery temperature operating ranges. The TMS includes a controller, heater, pump, and valves that control a flow rate of a convective fluid about the battery and other components. The TMS responds to battery temperature and differential signals, converting them into pump speed and heater signals utilizing a fuzzy logic multidimensional membership function (MF) that improves performance while reducing energy consumption by generating real-time, smoothed pulse width modulated (PWM) pump speed and heater signals. The MF capability requires less processing power than prior systems, which in turn enables improved response time to battery thermal and temperature rate changes during HEV operation. The MF utilizes embedded temperature and differential MFs that generate respective, real-time, tuned signal conversion factors, without the need for calibration look-up tables, to generate the PWM pump and heater control signals.

17 Claims, 4 Drawing Sheets

(51) Int. Cl.
*B60L 1/08* (2006.01)
*G05B 13/02* (2006.01)
*H02P 27/08* (2006.01)
*B60L 3/00* (2019.01)
*B60R 16/04* (2006.01)
*G01R 31/374* (2019.01)
*B60L 58/26* (2019.01)
*B60L 1/02* (2006.01)
*B60K 1/00* (2006.01)
*B60W 50/00* (2006.01)
*B60L 50/61* (2019.01)
*B60L 50/16* (2019.01)

(56) References Cited

U.S. PATENT DOCUMENTS

| | | | |
|---|---|---|---|
| 9,308,812 B2 | 4/2016 | Buford et al. | |
| 2004/0009075 A1* | 1/2004 | Meza | F04B 43/0054 417/32 |
| 2007/0068273 A1* | 3/2007 | Cunningham | G01L 3/247 73/781 |
| 2010/0079146 A1* | 4/2010 | Kurose | B60L 3/0046 324/433 |
| 2012/0082871 A1* | 4/2012 | Simonini | B60L 1/04 429/50 |
| 2015/0180249 A1* | 6/2015 | Jeon | H02J 5/005 320/108 |
| 2016/0079637 A1 | 3/2016 | Namesh et al. | |

* cited by examiner

BATTERY THERMAL CONDITIONING PUMP CONTROL FOR ELECTRIC VEHICLE

TECHNICAL FIELD

The disclosure relates to battery thermal conditioning pump controllers for electric vehicles.

BACKGROUND

Hybrid, plug-in, and battery electric vehicles (HEVs, PHEV, and BEVs) include high voltage electric traction batteries that can be undesirably affected by uncontrolled or inefficiently controlled temperature extremes. During operation, battery temperatures can be managed to optimize battery performance and life span. Previous HEV and other vehicle thermal management systems can see increased efficiency and improved battery if battery operating temperature changes can be managed without increased energy costs for heating and cooling the battery. HEV and battery performance can be affected by the ambient environment, which can introduce undesirable temperature extremes to batteries, components, and related systems. Prior attempts to manage battery temperatures have included efforts to predict battery heat generation, and to adjust coolant flow by controlling a pump speed or valves. There remains a need to improve battery temperature management by improving response times, decreasing energy consumption, and reducing resources needed to implement control systems.

SUMMARY

The disclosure is directed to an electric vehicle or HEV having, among other components, pump fuzzy-logic control system for maintaining an operating battery temperature range with a coolant pump and a heater. The controller or controllers of the system use battery temperature as well as rate of change of battery temperature, or a differential of temperature over time, to improve responsiveness of the system and control of the battery operating temperature to be more closely within predetermined limits or an optimal operating temperature range. The control system enables the fuzzy-logic control by employing membership functions to enhance control capabilities and system performance characteristics for managing both battery temperatures and temperature change rates, which enables design flexibility in establishing desired operating performance of the battery thermal management system.

The new battery temperature management system of this disclosure further enables minimization of both battery temperature changes and energy consumption during battery cooling or heating, by reducing control system complexity over comparable proportional-integral-derivative (PID) controllers in use for battery thermal pump control. The control system also improves performance and efficiency by controlling battery temperature during operation to be within a preferred range while conserving energy, and while enabling smoother pump speed control that avoids no large step changes in pump speed control commands. This also eliminates the need for calibration lookup tables that consume added control system memory and processor resources.

The disclosure is directed to a hybrid electric vehicle (HEV) and method of operation that has a thermal management system (TMS), which is configured to maintain optimal high-voltage traction battery temperature operating ranges. Among other components, the TMS includes one or more controller(s), a heater, a pump, valves, a refrigerant chiller, a radiator, and a heat exchanger, which cooperate to control a flow rate of a convective fluid about the battery and other components. The TMS may also include an engine mounted and/or an electrically operated compressor and/or chiller. The TMS responds to battery temperature and differential signals, converting them into pump speed and heater signals, by utilizing fuzzy logic multidimensional membership functions (Ws), which requires less processor power, time, and memory to perform the conversions, and which in turn improves response performance and reduces energy consumption by the controller and the controlled components.

The controller(s) utilize the MFs to generate real-time, smoothed, calibrated temperature control signal (TCS), which may include, for example, pulse width modulated (PWM) pump speed and heater signals, which signals enable improved response time, to battery thermal and temperature rate changes. Among other capabilities, the MFs include and utilize embedded temperature and differential MFs that are each configured to generate respective, real-time, tuned signal conversion factors and other parameters, which are utilized to generate the temperature and differential factors or components of the TCS and/or smoothed pump speed and heater signals. This is accomplished without the need for TMS and battery performance calibration look-up tables, which in past attempts contained large data sets having increased memory requirements, and which were previously needed to generate the TCS and/or PWM pump and heater control signals.

More specifically, in further arrangements, the HEV or vehicle includes the controller(s) coupled to the pump, which controls a flow rate of a convective fluid proximate a battery. The controller(s) are configured to respond to the battery temperature and differential signals (TDS), and to convert the TDS with the temperature and differential membership functions, to the TCS and/or the smoothed PWM speed and heater signal that corresponds to the TDS. The flow rate of the convective fluid is adjusted by the controller(s) by controlling the pump and valves with the TCS to maintain the battery temperature range.

In other variations, the HEV or vehicle according to the disclosure includes one or more controller(s) that may be in communication with and/or part of a thermal management system (TMS) that is configured to maintain an optimal battery thermal operating profile and/or operating temperature range during operation of the HEV. The TMS includes, among other components, a heater, and a pump and valves that manage a flow rate of a convective fluid about a heat exchanger proximate a battery, and a refrigerant chiller, and a radiator. The contemplated controller(s) is/are configured to respond to battery temperature and differential (TD) signals from the HEV. The differential signal is typically a differential with respect to time of the temperature signal, which identifies the rate of change of the temperature signal.

Further, the controller(s) convert(s) the TDS in real-time, utilizing an MF that includes one or more, or at least one, temperature and differential membership function(s). The MF(s) are employed to generate at least one of a smoothed pulse-width-modulated (PWM), pump speed signal and a heating signal. The controller(s) adjust the pump speed and convective fluid flow rate with the pump speed signal, which enables maintenance of the optimal battery temperature range. Further, the battery heater is similarly adjusted by the controller(s) with the heating signal, to also maintain the optimal battery temperature range.

During operation, the controller(s) are configured with the temperature membership function (TMF) responsive to and configured to convert the battery temperature signal to a temperature factor of the smoothed PWM speed and heating signals. The TMF is configured to include temperature categories (MF-TCs) that each: (a) overlappingly span predetermined temperature set points (T-SPs), (b) generate membership degrees (TMF-MDs) corresponding to the battery temperature signal, and (c) generate at least one TCS calibration factor (TCF). The controller(s) utilize this TMF to then generate the temperature factor according to a combination of the TMF-MDs and at least one of the generated TCF and HS TCF, as described elsewhere herein.

Similarly, the controller(s) may be further arranged to have the differential membership function (DMF) respond to and be configured to convert the battery differential signal, to a differential factor of the smoothed PWM speed and heating signals. Also, the DMF is further similarly configured to include rate categories (MF-RCs) that each: (a) overlappingly span change rate set points (CR-SPs), (b) generate membership degrees (DMF-MDs) corresponding to the battery differential signal, and (c) generate a TCS calibration factor (TCF). As with the TMF, the controller(s) utilize the DMF to also generate the differential factor according to a combination of the DMF-MDs and at least one of the generated TCFs, as explained further in the disclosure.

Also contemplated by the disclosure are methods of controlling the HEV or vehicle, which include, for purposes of example but not limitation, commanding by the controller, in response to the battery temperature and differential (TD) signals, the pump configured to control the flow rate of the convective fluid proximate the battery. The method also enables converting by the controller, the TDS with temperature and differential membership functions, to a speed signal or pump speed signal. The controller(s) of the method are also capable of adjusting the pump speed and/or the flow rate, to maintain the battery temperature range by controlling the pump and/or the flow rate with the PWM speed signal. The battery heater is similarly adjustably controllable with the PWM heater signal to maintain the battery temperature range.

The methods of the disclosure in additional variations are also configured for commanding by the controller, the thermal management system (TMS) incorporating the pump and convective fluid, and further including the heater and heat exchanger to be proximate the battery, and to also include one or more valves that are in communication with the pump to further control the flow rate to a refrigerant chiller and a radiator, for additional heat exchange capabilities. The controller(s) are similarly configured for adjusting the heater and the one or more valves to also control the flow rate through the heat exchanger, chiller, and radiator, to maintain the battery temperature range.

The HEV further contemplates the methods to include converting by the controller the TDS, to smoothed pulse-width-modulated (PWM) pump speed and heating signals. The controllers also are configured for adjusting the heater with the smoothed PWM heating signal, and adjusting the flow rate by the pump and valves with the PWM pump speed signal to control the flow rate through the heat exchanger, chiller, and radiator, which in turn maintain the battery temperature range. As with other adaptations of the disclosure, the controller(s) are also enabled for converting the TDS to the smoothed PWM speed and heating signals to include temperature and differential factors and to include the temperature and differential MFs as already described. The methods may further include generating the at least one TCF, which corresponds to the temperature and rate categories. These methods additionally contemplate generating the converted PWM speed and heating signals respectively by the TMF and DMF from the combination of the generated TCF, TMF-MDs, DMF-MDs, and the temperature and differential factors.

This summary of the implementations and configurations of the HEVs and described components and systems introduces a selection of exemplary implementations, configurations, and arrangements, in a simplified and less technically detailed arrangement, and such are further described in more detail below in the detailed description in connection with the accompanying illustrations and drawings, and the claims that follow.

This summary is not intended to identify key features or essential features of the claimed technology, nor is it intended to be used as an aid in determining the scope of the claimed subject matter. The features, functions, capabilities, and advantages discussed here may be achieved independently in various example implementations or may be combined in yet other example implementations, as further described elsewhere herein, and which may also be understood by those skilled and knowledgeable in the relevant fields of technology, with reference to the following description and drawings.

BRIEF DESCRIPTION OF THE DRAWINGS

A more complete understanding of example implementations of the present disclosure may be derived by referring to the detailed description and claims when considered with the following figures, wherein like reference numbers refer to similar or identical elements throughout the figures. The figures and annotations thereon are provided to facilitate understanding of the disclosure without limiting the breadth, scope, scale, or applicability of the disclosure. The drawings are not necessarily made to scale.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

As those of ordinary skill in the art should understand, various features, components, and processes illustrated and described with reference to any one of the figures may be combined with features, components, and processes illustrated in one or more other figures to enable embodiments that should be apparent to those skilled in the art, but which may not be explicitly illustrated or described. The combinations of features illustrated are representative embodiments for typical applications. Various combinations and modifications of the features consistent with the teachings of this disclosure, however, could be desired for particular applications or implementations, and should be readily within the knowledge, skill, and ability of those working in the relevant fields of technology.

Figure 1:
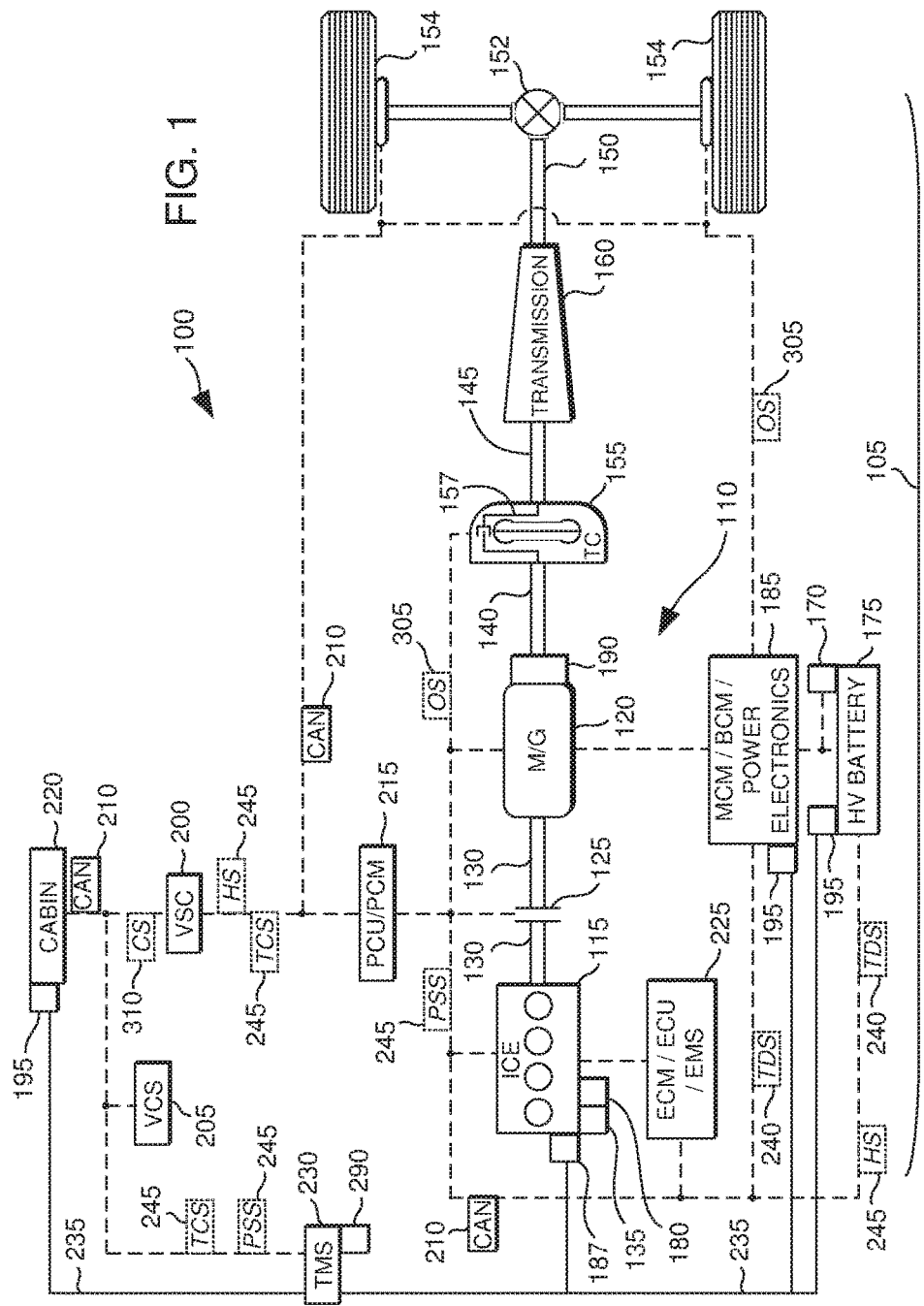
FIG. 1 is an illustration of a hybrid electric vehicle and its systems, components, sensors, actuators, and methods of operation.

With reference now to the various figures and illustrations and to FIGS. 1, 2, 3, and 4, and also specifically to FIG. 1, a schematic diagram of a hybrid electric vehicle (HEV) 100 is shown. Illustrated are representative relationships among components of HEV 100, which can also be an electric vehicle (EV), a battery electric vehicle (BEV), a plug-in hybrid electric vehicle (PHEV), and combinations and modifications thereof, which are herein collectively referred to as an "HEV". Physical placement and orientation of the components within vehicle 100 may vary. Vehicle 100 includes a driveline 105 that has a powertrain 110, which includes an internal combustion engine (ICE) 115 and an electric machine or electric motor/generator/starter (M/G) 120, which generate power and torque to propel vehicle 100. Engine or ICE 115 is a gasoline, diesel, biofuel, natural gas, or alternative fuel powered engine, or a fuel cell, which generates an output torque in addition to other forms of electrical, cooling, heating, vacuum, pressure, and hydraulic power by way of front end engine accessory devices (FEADs) described elsewhere herein. ICE 115 is coupled to electric machine or M/G 120 with a disconnect clutch 125. ICE 115 generates such power and associated engine output torque for transmission to M/G 120 when disconnect clutch 125 is at least partially engaged.

M/G 120 may be any one of a plurality of types of electric machines, and for example may be a permanent magnet synchronous motor, electrical power generator, and engine starter 120. For example, when disconnect clutch 125 is at least partially engaged, power and torque may be transmitted from engine 115 to M/G 120 to enable operation as an electric generator, and to other components of vehicle 100. Similarly, M/G 120 may operate as a starter for engine 115 with disconnect clutch 125 partially or fully engaged to transmit power and torque via disconnect clutch drive shafts 130 to engine 115 to start engine 115, in vehicles that include or do not include an independent engine starter 135.

Further, M/G or electric machine 120 may assist engine 115 in a "hybrid electric mode" or an "electric assist mode" by transmitting additional power and torque to turn drive shafts 130 and 140. Also, M/G 120 may operate in an electric only mode wherein engine 115 is decoupled by disconnect clutch 125 and which may be shut down, enabling M/G 120 to transmit positive or negative (reverse) mechanical torque to M/G drive shaft 140 in forward and reverse directions. When in a generator mode, M/G 120 may also be commanded to produce negative electrical torque (when being driven by ICE 115 or other drivetrain elements) and to thereby generate electricity for charging batteries and powering vehicle electrical systems, and while ICE 115 is generating propulsion power for vehicle 100. M/G 120 also may enable regenerative braking when in generator mode by converting rotational, kinetic energy from powertrain 110 and/or wheels 154 during deceleration, into negative electrical torque, and into regenerated electrical energy for storage, in one or more batteries 175, 180, as described in more detail below.

Disconnect clutch 125 may be disengaged to enable engine 115 to stop or to run independently for powering engine accessories, while M/G 120 generates drive power and torque to propel vehicle 100 via M/G drive shaft 140, torque convertor drive shaft 145, and transmission output drive shaft 150. In other arrangements, both engine 115 and M/G 120 may operate with disconnect clutch 125 fully or partially engaged to cooperatively propel vehicle 100 through drive shafts 130, 140, 150, differential 152, and wheels 154. Each or any such components may also be combined in part and/or entirely in a comparable transaxle configuration (not shown). Driveline 105 may be further modified to enable regenerative braking from one or any or all wheel(s) 154, using a selectable and/or controllable differential torque capability. Although FIG. 1 schematically depicts two wheels 154, the disclosure contemplates drive line 105 to include additional wheels 154.

The schematic of FIG. 1 also contemplates alternative configurations with more than one engine 115 and/or M/G 120, which may be offset from drive shafts 130, 140, and where one or more of engines 115 and M/Gs 120 are positioned in series and/or in parallel elsewhere in driveline 105, such as between or as part of a torque convertor and a transmission, and/or a transaxle, off-axis from the drive shafts, and/or elsewhere and in other arrangements. Still other variations are contemplated without deviating from the scope of the present disclosure. Driveline 105 and powertrain 110 also include a transmission that includes a torque convertor (TC) 155, which couples engine 115 and M/G 120 of powertrain 110 with and/or to a transmission 160. TC 155 may further incorporate a bypass clutch and clutch lock 157 that may also operate as a launch clutch, to enable further control and conditioning of the power and torque transmitted from powertrain 110 to other components of vehicle 100.

In other variations, a vehicle component heating device is included such as a battery heater and heaters 170, which when heated, enables improved charging and discharging efficiency of battery(ies) that incorporate chemistries having preferred temperature operating ranges. Heater(s) 170 may be electrically powered by one or more of batteries 175, 180, an ICE mounted device also known as a front end accessory device (FEAD) alternator or generator, M/G 120, or other components. Heater(s) 170 may also be enabled to be heated and cooled and have temperature controlled by convective fluid flow along and/or in combination with a thermal control system and capability as described elsewhere herein. Powertrain 110 and/or driveline 105 further include one or more batteries 175, 180, as well as other types of energy storage devices that can store and release electrical, thermal, and/or kinetic energy.

One or more such batteries can be a higher voltage, direct current battery or batteries 175 operating in ranges between about 48 to 600 volts, and sometimes between about 140 and 300 volts or more or less, which is/are used to store and supply power for M/G 120 and during regenerative braking for capturing and storing energy, and for powering and storing energy from other vehicle components and accessories. Other batteries can be a low voltage, direct current battery(ies) 180 operating in the range of between about 6 and 24 volts or more or less, which is/are used to store and supply power for starter 135 to start engine 115, and for other vehicle components and accessories.

Batteries 175, 180 are respectively coupled to engine 115, M/G 120, and vehicle 100, as depicted in FIG. 1, through various mechanical and electrical interfaces and vehicle controllers, as described elsewhere herein. High voltage M/G battery 175 is also coupled to M/G 120 by one or more of a motor control module (MCM), a battery control module (BCM), and/or power electronics 185, which are configured to convert and condition direct current (DC) power provided by high voltage (HV) battery 175 for M/G 120. MCM/BCM/power electronics 185 are also configured to condition, invert, and transform DC battery power into three phase alternating current (AC) as is typically required to power electric machine or M/G 120. MCM/BCM 185/power electronics is also configured to charge one or more batteries 175, 180 with energy generated by M/G 120 and/or front end accessory drive components, and to receive, store, and supply power from and to other vehicle components as needed.

Vehicle 100 may also incorporate one or more refrigerant compressors 187, which may be an ICE-mounted front end accessory device, and/or an electrically driven and/or operated device mounted on or about the ICE 115 or elsewhere on HEV 100, for example such as about M/G 120 to be powered thereby. Cooperatively coupled to the compressor(s) 187, at least one chiller 190 may also be incorporated to enable heat exchange between refrigerant from the compressor(s) 187 and other components. As with the compressor(s) 187, the chiller(s) 190 may be ICE-mounted as a belt or direct driven front end accessory, mounted about M/G 120 whereby integral pumps are driven thereby, or elsewhere about HEV 100. Heat exchangers such as heat sinks or plates or evaporators 195 may be coupled with one or more of the compressor(s) 187 and the chiller(s) 190 to enable heat exchange with a passenger compartment 220 of HEV 100, battery(ies) 175, 180, MCM/BCM/power electronics 185, and other vehicle components that may require heating and/or cooling.

With continued reference to FIG. 1, vehicle 100 further includes one or more controllers and computing modules and systems, in addition to MCM/BCM/power electronics 185, which enable a variety of vehicle capabilities. For example, vehicle 100 may incorporate a vehicle system controller (VSC) 200 and a vehicle computing system (VCS) and controller 205, which are in communication with MCM/BCM 185, other controllers, and a vehicle network such as a controller area network (CAN) 210, and a larger vehicle control system and other vehicle networks that include other micro-processor-based controllers as described elsewhere herein. CAN 210 may also include network controllers in addition to communications links between controllers, sensors, actuators, and vehicle systems and components. VCS 205 may be configured with one or more communications, navigation, and other sensors, and can cooperate in parallel, in series, and distributively with VSC 200 and other controllers to manage and control the vehicle 100 in response to sensor and communication signals identified, established by, communicated to, and received from these vehicle systems and components.

While illustrated here for purposes of example, as discrete, individual controllers, MCM/BCM 185, VSC 200 and VCS 205 may control, be controlled by, communicate signals to and from, and exchange data with other controllers, and other sensors, actuators, signals, and components that are part of the larger vehicle and control systems, external control systems, and internal and external networks. The capabilities and configurations described in connection with any specific micro-processor-based controller as contemplated herein may also be embodied in one or more other controllers and distributed across more than one controller such that multiple controllers can individually, collaboratively, in combination, and cooperatively enable any such capability and configuration. Accordingly, recitation of "a controller" or "the controller(s)" is intended to refer to such controllers both in the singular and plural connotations, and individually, collectively, and in various suitable cooperative and distributed combinations.

Further, communications over the network and CAN 210 are intended to include responding to, sharing, transmitting, and receiving of commands, signals, data, embedding data in signals, control logic, and information between controllers, and sensors, actuators, controls, and vehicle systems and components. The controllers communicate with one or more controller-based input/output (I/O) interfaces that may be implemented as single integrated interfaces enabling communication of raw data and signals, and/or signal conditioning, processing, and/or conversion, short-circuit protection, circuit isolation, and similar capabilities. Alternatively, one or more dedicated hardware or firmware devices, controllers, and systems on a chip may be used to precondition and preprocess particular signals during communications, and before and after such are communicated.

In further illustrations, MCM/BCM 185, VSC 200, VCS 205, CAN 210, and other controllers, may include one or more microprocessors or central processing units (CPU) in communication with various types of computer readable storage devices or media. Computer readable storage devices or media may include volatile and nonvolatile storage in read-only memory (ROM), random-access memory (RAM), and non-volatile or keep-alive memory (NVRAM or KAM). NVRAM or KAM is a persistent or non-volatile memory that may be used to store various commands, executable control logic and instructions and code, data, constants, parameters, and variables needed for operating the vehicle and systems, while the vehicle and systems and the controllers and CPUs are unpowered or powered off. Computer-readable storage devices or media may be implemented using any of a number of known memory devices such as PROMs (programmable read-only memory), EPROMs (electrically PROM), EEPROMs (electrically erasable PROM), flash memory, or any other electric, magnetic, optical, or combination memory devices capable of storing and communicating data.

With attention invited again to FIG. 1, vehicle 100 also may include VCS 205 to be the SYNC onboard vehicle computing system manufactured by the Ford Motor Company (See, for example, U.S. Pat. No. 9,080,668). Vehicle 100 also may include a powertrain control unit/module (PCU/PCM) 215 coupled to VSC 200 or another controller, and coupled to CAN 210 and engine 115, M/G 120, and TC 155 to control each powertrain component. A transmission control unit may also be coupled to VSC 200 and other controllers via CAN 210, and is coupled to transmission 160 and also optionally to TC 155, to enable operational control. An engine control module (ECM) or unit (ECU) or energy management system (EMS) 225 may also be included having respectively integrated controllers and be in communication with CAN 210, and is coupled to engine 115 and VSC 200 in cooperation with PCU 215 and other controllers.

In this arrangement, VSC 200 and VCS 205 cooperatively manage and control the vehicle components and other controllers, sensors, and actuators. For example, the controllers may communicate control commands, logic, and instructions and code, data, information, and signals to and/or from engine 115, disconnect clutch 125, M/G 120, TC 155, transmission 160, batteries 175, 180, and MCM/BCM/power electronics 185, and other components and systems. The controllers also may control and communicate with other vehicle components known to those skilled in the art, even though not shown in the figures. The embodiments of vehicle 100 in FIG. 1 also depict exemplary sensors and actuators in communication with vehicle network and CAN 210 that can transmit and receive signals to and from VSC 200, VCS 205, and other controllers.

For further example, various other vehicle functions, actuators, and components may control and/or be controlled by the controllers within the vehicle systems and components, and may generate and receive signals from other controllers, sensors, and actuators, which may include, for purposes of illustration but not limitation, front-end accessory drive (FEAD) components and various sensors for battery charging or discharging, including sensors for detecting and/or determining the maximum charge, charge-state or state-of-charge (SoC), discharge power limits, battery and power electronics temperatures and rates of change thereof, external environment ambient air temperature and cabin and component temperatures, voltages, currents, and battery discharge power and rate limits and changes, and other components.

Figure 2:
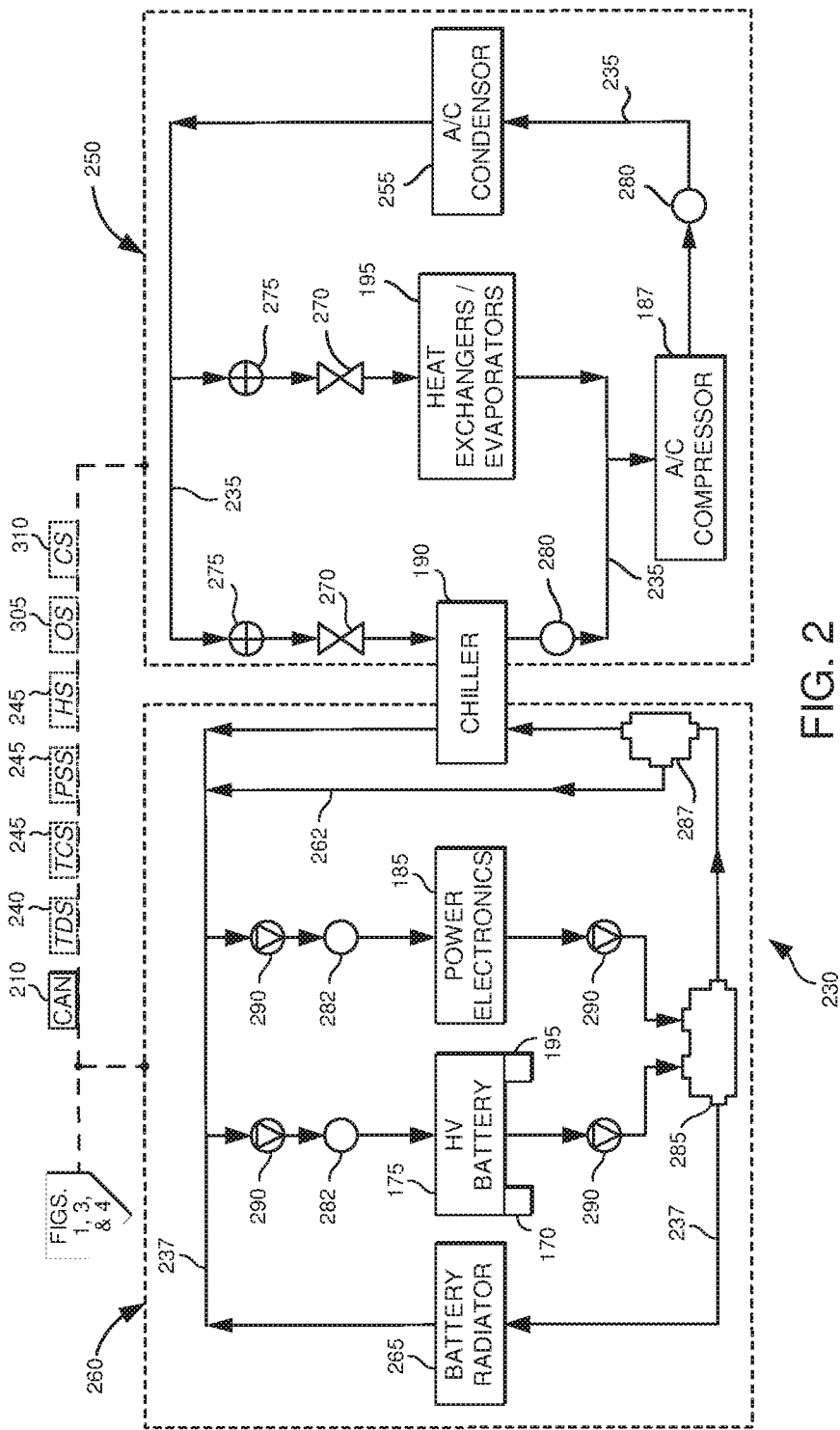
FIG. 2 illustrates certain aspects of the disclosure depicted in FIG. 1, with components removed and rearranged with revised details for purposes of illustration.

With continuing reference to the various figures, especially now FIGS. 1 and 2, the disclosure contemplates HEV 100 including ICE 115 coupled with electric machine or M/G 120 and high-voltage (HV) storage battery 175 and MCM/BCM/power electronics 185. At least one of an engine mounted and/or an electrically operated refrigerant compressor 187 and/or chiller 190, each having a convective fluid, are incorporated in addition to heater 170. The heater 170, compressor 187, and chiller 190 each are configured having respective heat exchange capacities, and form a part of and are coupled with refrigerant and coolant distribution and thermal management system (TMS) 230. The TMS 230 includes data, signal, and power communication lines (shown in the various figures and schematics as dashed lines), as well convective fluid refrigerant lines 235 and coolant lines 237, which communicate power, data, convective fluids such as a refrigerant and a coolant, between heater(s) 170, compressor 187, and chiller 190, and the heat exchangers, plates, sinks, and/or evaporators 195 located about passenger cabin 220 and HV battery 175 and power electronics 185.

HEV 100 and TMS 230 also include one or more controllers coupled to these and other HEV components. Such controllers, including for example, those incorporated with TMS 230, power electronics 185, and/or other controllers, are configured to cool and heat the battery(ies) 175 during charging and discharging, and to adjust and control cooling and heating rates. These controller(s), including for example those included with TMS 230, manage distribution of heat exchange capacity to control the temperatures of components such as HV battery 175 and coupled power electronics 185.

With continued reference to the various figures and specifically now also to FIG. 2, additional details of TMS 230 schematically depict the contemplated HEV 100 thermal management system configured to manage the heating and cooling needed to operate HEV 100. Although the disclosure primarily describes various cooling related, heat exchange capabilities, for purposes of illustration, those knowledgeable in the relevant fields of technology should understand that TMS 230 is configured to enable both cooling and heating of various components of HEV 100, including for example, the battery(ies) 175, 180, and other vehicle components. It may be understood that FIG. 2 depicts aspects of the cooling components of TMS 230. However, those skilled in the technology should appreciate with reference also to FIG. 1, that fluid and electric heating capabilities are also enabled and contemplated, and include for example without limitation, the exemplary heater 170, among other heating components, which may cooperate with TMS 230 and other controllers to warm and heat various components, such as heat exchangers 195 that are coupled with the battery(ies) 175, power electronics 185, and other components.

The controllers of TMS 230, power electronics 185, VSC 200, VCS 205, and others are configured to detect temperatures, and differential temperatures or rates of change of temperature using the temperature and pressure sensors 280, and temperature sensors 282, and to generate temperature signals (TS) 240 and differential temperature signals (DS) 240, which may also be referred to collectively as temperature and differential temperature signals (TDS or TDSs) 240, which identify, establish, and communicate such temperatures and differential temperatures. In response to the TDSs 240, the controller or controllers initiate heat exchange and temperature control of the battery(ies) 175 and other components to enable optimum battery performance during charging and discharging operation.

Figure 3:
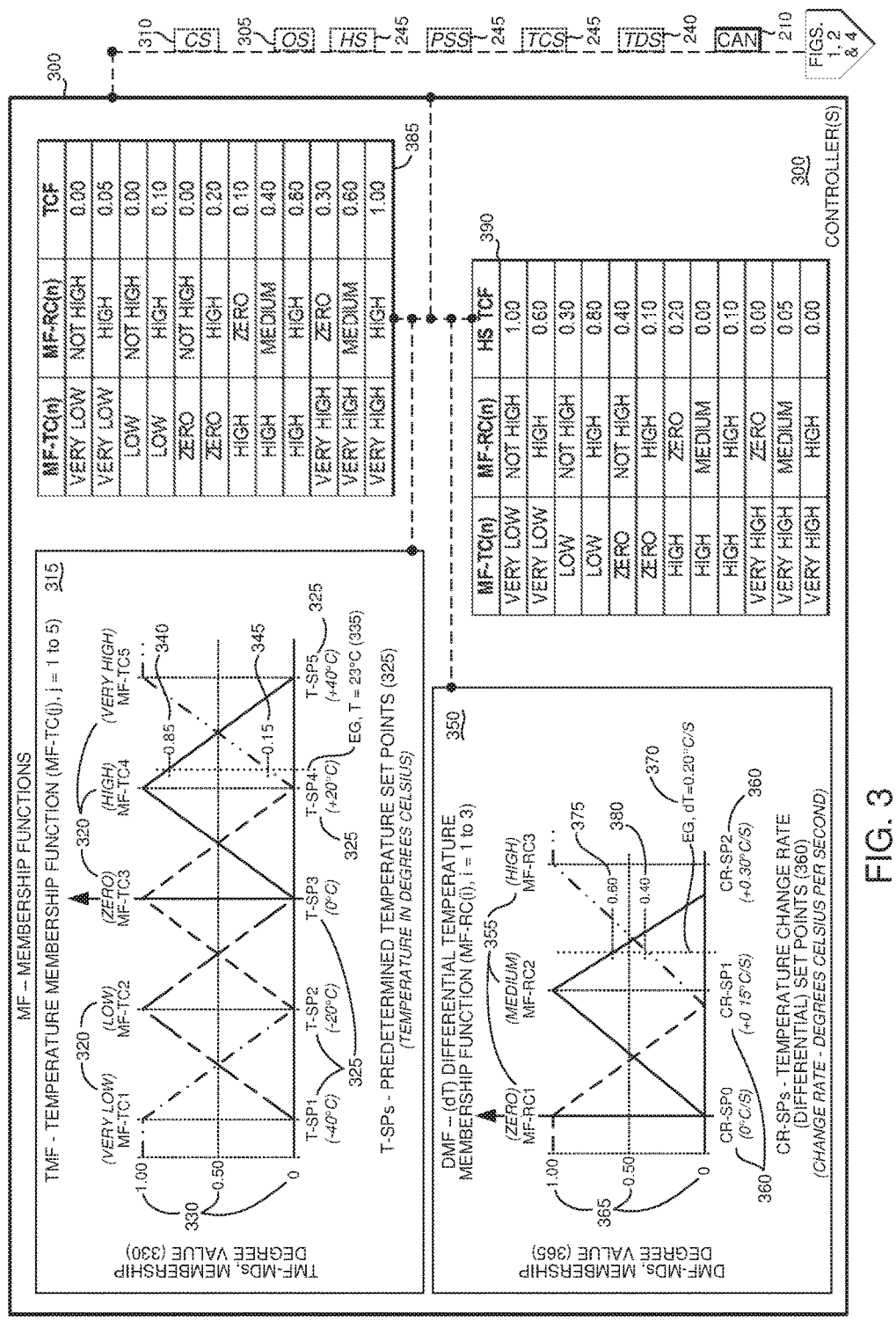
FIG. 3 illustrates additional aspects and capabilities of the vehicle and systems and methods of FIGS. 1 and 2, with certain components removed and rearranged for further purposes of illustration.

With continuing reference to FIGS. 1 and 2, and now also to FIG. 3, it may be understood by those knowledgeable in the field of technology that HEV 100 and the various controllers may be configured to initiate and control heat exchange and temperature control of battery(ies) 175 and other components to enable improved efficiency and performance during operation. The controllers further include fuzzy logic, membership function or function (MFs) 300, such as a temperature MF 315 and a differential MF 350, which are configured to convert TDSs 240 into smoothed, pulse-width modulated (PWM) temperature control signals (TCS) 245 that control the heat exchange between battery (ies) 175 and TMS 230. The converted TCS 245 may include, represent, and/or communicate pump speed signals (PSS) 245 and/or heating signals (HS) 245 that are generated by the fuzzy logic membership functions (Ws) 300. TCS 245 may be utilized to adjust pump and valve and heating power configurations to control convective fluid flow, as well as to control the electrically-powered and/or convective fluid controller performance of heater 170, to adjust, maintain, and control the temperatures and/or temperature ranges of battery(ies) 175, and other components of HEV 100.

TMS 230 is typically configured to also include at least one refrigerant circuit 250 that may use a convective fluid or refrigerant such as R134a, and which may include refrigerant lines 235 coupling air conditioning (A/C) compressor 187 with an A/C condenser 255, heat exchangers/evaporators 195, and chiller 190, among other components. TMS 230 also may usually include at least one coolant circuit 260 (in addition to and/or in cooperation with any coolant circuit included with ICE 115), which may use another convective fluid or coolant similar to any of a number of commonly available ICE antifreeze coolants, and configured to heat and/or cool one or more non-ICE 115 components. Coolant circuit 260 may further incorporate coolant lines 237 coupling heater(s) 170 and/or chiller 190 with one or more non-ICE components, including for example at least one of HV battery 175, BCM/MCM/power electronics 185, and a battery/power electronics radiator 265, among other components.

The TMS 230 may further incorporate various sensors, pumps, and valves, and can include for example, one or more thermal expansion valves 270 and/or solenoid operated valves 275 incorporated about refrigerant circuit 250 and coupled to refrigerant lines 235 and heat exchangers/evaporators 195 and chiller 190. Both refrigerant circuit 250 and coolant circuit 260 may incorporate temperature and pressure sensors 280, and temperature sensors 282, at various locations about components such as battery(ies) 175, power electronics 185, and refrigerant lines 235 and coolant lines 237, along with electrically actuated and driven multiple-position valves 285 that control and switch flow between outputs, proportional valves 287 that enable differential flow to multiple outputs, and pumps 290, positioned and configured to control coolant and refrigerant flow and flow rates.

The various valves and pumps may also be included and utilized for configurations where the chiller 190 may be utilized for heat transfer between heat exchangers/evaporators 195, cabin 240, and other components of coolant circuit 260. In further arrangements, coolant circuit 260 may include a chiller bypass coolant line 262, which may enable proportional flow with proportional valve 287 between bypass line 262 and chiller 190, for coolant circuit 260 operations during heating/cooling when refrigerant circuit 250 is unavailable or otherwise unneeded, and for chiller cooling via radiator 265. Each of such components of TMS 230 cooperatively enable thermal control of HV battery(ies) 175 and/or other batteries, and/or power electronics 185, by utilizing one or more of the controllers, such as those included with BCM/MCM/power electronics 185.

As described and illustrated in the various figures, including FIGS. 1, 2, and 3, the signals and data, including for example, TDSs 240, TCS 245, and related control logic and executable instructions and other signals, and data can also include other signals (OS) 305, and control or command signals (CS) 310 received from and sent to and between controllers and vehicle components and systems. The TDSs 240, TCSs 245, OS 305, and CS 310 may be generated, established, communicated, to, from, and between any of the vehicle controllers, sensors, actuators, components, and systems signals. Any and/or all of these signals can be raw analog or digital signals and data, or preconditioned, preprocessed, combination, and/or derivative data and signals generated in response to other signals, and may represent and be represented by voltages, currents, capacitances, inductances, impedances, signal pulse widths and frequencies and modulations, and digital data representations thereof, as well as digital information that embeds such signals, data, and analog, digital, and multimedia information.

The communication and operation of the described signals, commands, control instructions and logic, and data and information by the various contemplated controllers, sensors, actuators, and other vehicle components, may be represented schematically as shown in FIGS. 1, 2, and 3, and other figures, formulas, and equations, and by flow charts or similar diagrams as exemplified in the methods of the disclosure illustrated specifically herein. Such flow charts and diagrams illustrate exemplary commands and control processes, control logic and instructions, and operation strategies, which may be implemented using one or more computing, communication, and processing techniques that can include real-time, event-driven, interrupt-driven, multi-tasking, multi-threading, and combinations thereof. The steps and functions shown may be executed, communicated, and performed in the sequence depicted, and in parallel, in repetition, in modified sequences, and in some cases may be combined with other processes and/or omitted. The commands, control logic, and instructions may be executed in one or more of the described microprocessor-based controllers, in external controllers and systems, and may be embodied as primarily hardware, software, virtualized hardware, firmware, virtualized hardware/software/firmware, and combinations thereof.

With continued reference to FIGS. 1, 2, and 3, HEV 100 includes variations wherein the controller(s) are responsive to battery temperature and differential signals (TDS) 240, and are configured to control and are coupled to the pump(s) 290 and valves 270, 275, 285, 287. The controller(s) is/are further configured to control the flow rate of convective fluid, such as the refrigerant and/or coolant, proximate the battery(ies) 175, which may be accomplished with the heat exchanger(s) 195 and/or heater(s) 170, or other components. The controller(s) is/are enabled to convert TDS 240 with membership function(s) (MFs) 300, such as for example, temperature MF 315 and differential MF 350, to a smoothed, calibrated temperature control signal (TCS) 245 corresponding to the TDS 240. Such controller(s) further adjust the flow rate to maintain a battery temperature range by controlling the convective fluid flow rate with the pumps 290 and valves 270, 275, 285, 287 with TCS 245.

Temperature and differential MFs (TMF) 315, (DMF) 350 are further configured to generate the converted TCS 245 in real-time and with greater resolution and precision, such that changes to TCS 245 more closely correspond to changes in TDS 240. The higher precision results in the converted TCS 245 being generated and adjusted to be smooth and substantially continuous, and to have less jitter from one change to the next, as the MFs 300 convert the changing TDS 240. Other methods, such as look-up tables and conversion algorithms having discrete steps, boundary conditions, and the like, may prevent and be unable to generate real-time, smooth, jitterless conversions of TDS 240, and instead may cause the converted TCS 245 to exhibit large steps and discontinuities from one change to the next, which can expend unneeded energy in controlling the pumps, valves, and heater, cause less than optimal temperature control of battery(ies) 175 and other components of HEV 100, and which can adversely affect the lifecycle performance of TMS 230.

TMF 315 and DMF 350 are also configured to calibrate converted TCS 245 to further improve the precision with which TMS 230 controls the temperature of battery(ies) 175 and other components, as explained elsewhere herein. Such increased precision and smoothing may be further achieved by controller(s) and MFs 300 by generating TCS 245 to be a pulse-width-modulated (PWM) signal.

The contemplated PWM signal may be calibrated to have a switching frequency and duty cycle tuned to have the improved precision and resolution, and to be compatible for use with selected valves 270, 275, 285, 287, and pumps 290. Further, the TCS 245 may be generated as PWM control, speed signals 245, and heating signals 245 that respectively adjust(s) operation of heater 170, and valves 270, 275, 285, 287, speed of pumps 290, convective fluid flow rate, and performance of heater 170.

In variations, and with continued reference to FIG. 3, the disclosure includes the controller(s) further incorporating and/or configured with and/or as temperature membership function (TMF) 315 (FIG. 3 and Equation 1), which is responsive to and configured to convert battery temperature signal TDS 240 to TCS 245.

$$TCS = \frac{\sum_{i=1}^{MF\_RCn} \sum_{j=1}^{MF\_TCn} (TCF_{i,j} \times TMF_j(T) \times DMF_i(dT))}{\sum_{i=1}^{MF\_RCn} \sum_{j=1}^{MF\_TCn} (TMF_j(T) \times DMF_i(dT))}$$

EQUATION 1

The TCS 245 is converted from TDS 240 to further include a temperature factor (TF) (Equation 2) and a differential factor (DF) (Equation 3).

$$\text{TEMPERATURE FACTOR} = \sum_{j=1}^{MF-TCn} (TMF_j(T)) \quad \text{EQUATION 2}$$

$$\text{DIFFERENTIAL FACTOR} = \sum_{i=1}^{MF-RCn} (DMF_i(dT)) \quad \text{EQUATION 3}$$

TMF 315 is further configured to generate TF from TDS 240, and to include MF temperature categories (MF-TCs) 320, with each MF-TC 320 overlappingly spanning predetermined and/or calculated MF temperature set points (T-SPs) 325.

For illustration purposes, each MF-TC 320 may typically be overlappingly calibrated to be centered about one of predetermined and/or calculated T-SPs 325. While the number, configuration, and calibration of such MF-TCs 320 and T-SPs may be adjusted for various preferred applications, in this exemplary depiction of FIG. 3, five MF-TCs 320 and five T-SPs 325 are predetermined, selected, calculated, and/or calibrated, although a one to one, MF-TC and T-SP correspondence is not required.

Here, TMF 315 is illustrated as an example to have MF-TCs 320 or MF-TC(i) as "i" is iterated from 1 to "n," where in this example n=5, and to include MF-TC1 category "very low", MF-TC2 category "low", MF-TC3 category "zero", MF-TC4 category "high", and MF-TC5 category "very high".

These MF-TC categories 320 are overlappingly, respectively centered on T-SPs 325 that include, for example but not limitation, T-SP1 of −40 degrees Celsius (° C.), T-SP2 of −20° C., T-SP3 of zero ° C., T-SP4 of 20° C., and T-SP5 of 40° C.

During TMF 315 conversion of TDS 240, the controller(s) generate(s) and/or establish(es) membership degrees (TMF-MDs) 330 that correspond to TDS 240, according to and as a function of MF-TCs 320 and T-SPs 325. Such TMF-MDs 330 establish a continuous correspondence to TDS 240 and reflect a continuous relationship of TDS 240 and a degree of the relationship with each category MF-TC category 320.

With continued reference to FIG. 3 and Equation 1, and also now to Table 1, in one example, TMF 315 controller(s) may receive and convert a TDS 240 such as TDS 335 (FIG. 3) that represents, for purposes of illustration but not limitation, a detected battery temperature of about 23 degrees Celsius (see also, Table 1, EG, T=23° C.), which is detected at some exemplary time during operation of HEV 100.

The controller(s) via TMF 315 detect the TDS 335 of 23 degree-Celsius to be in overlapping categories 320 of both MF-TC4 (high) and MF-TC5 (very high). TMF 315 then generates respective TMF-MD 340 of 0.85 for MF-TC4 category "high" and overlapping TMF-MD 345 of 0.15 for MF-TC5 category "very high".

TABLE 1

EXAMPLE MF TEMPERATURE FACTOR, TD SIGNAL CONVERSIONS

| Battery Temp. Set Point T-SP(j) | MEMBERSHIP FUNCTION CATEGORIES (MF-TC(j)) | | | | |
|---|---|---|---|---|---|
| | Very Low MF-TC1 | Low MF-TC2 | Zero MF-TC3 | High MF-TC4 | Very High MF-TC5 |
| T-SP0 −40° C. | $TMF_{TC1}(T) = 1.00$ | $TMF_{TC2}(T) = 0$ | $TMF_{TC3}(T) = 0$ | $TMF_{TC4}(T) = 0$ | $TMF_{TC5}(T) = 0$ |
| EG, T = −35° C. | $TMF_{TC1}(T) = 0.75$ | $TMF_{TC2}(T) = 0.25$ | $TMF_{TC3}(T) = 0$ | $TMF_{TC4}(T) = 0$ | $TMF_{TC5}(T) = 0$ |
| EG, T = −30° C. | $TMF_{TC1}(T) = 0.50$ | $TMF_{TC2}(T) = 0.50$ | $TMF_{TC3}(T) = 0$ | $TMF_{TC4}(T) = 0$ | $TMF_{TC5}(T) = 0$ |
| EG, T = −25° C. | $TMF_{TC1}(T) = 0.25$ | $TMF_{TC2}(T) = 0.75$ | $TMF_{TC3}(T) = 0$ | $TMF_{TC4}(T) = 0$ | $TMF_{TC5}(T) = 0$ |
| T-SP1 −20° C. | $TMF_{TC1}(T) = 0$ | $TMF_{TC2}(T) = 1.00$ | $TMF_{TC3}(T) = 0$ | $TMF_{TC4}(T) = 0$ | $TMF_{TC5}(T) = 0$ |
| EG, T = −15° C. | $TMF_{TC1}(T) = 0$ | $TMF_{TC2}(T) = 0.75$ | $TMF_{TC3}(T) = 0.25$ | $TMF_{TC4}(T) = 0$ | $TMF_{TC5}(T) = 0$ |
| EG, T = −10° C. | $TMF_{TC1}(T) = 0$ | $TMF_{TC2}(T) = 0.50$ | $TMF_{TC3}(T) = 0.50$ | $TMF_{TC4}(T) = 0$ | $TMF_{TC5}(T) = 0$ |
| EG, T = −5° C. | $TMF_{TC1}(T) = 0$ | $TMF_{TC2}(T) = 0.25$ | $TMF_{TC3}(T) = 0.75$ | $TMF_{TC4}(T) = 0$ | $TMF_{TC5}(T) = 0$ |
| T-SP3 0° C. | $TMF_{TC1}(T) = 0$ | $TMF_{TC2}(T) = 0$ | $TMF_{TC3}(T) = 1.00$ | $TMF_{TC4}(T) = 0$ | $TMF_{TC5}(T) = 0$ |
| EG, T = +5° C. | $TMF_{TC1}(T) = 0$ | $TMF_{TC2}(T) = 0$ | $TMF_{TC3}(T) = 0.75$ | $TMF_{TC4}(T) = 0.25$ | $TMF_{TC5}(T) = 0$ |
| EG, T = +10° C. | $TMF_{TC1}(T) = 0$ | $TMF_{TC2}(T) = 0$ | $TMF_{TC3}(T) = 0.50$ | $TMF_{TC4}(T) = 0.50$ | $TMF_{TC5}(T) = 0$ |
| EG, T = +15° C. | $TMF_{TC1}(T) = 0$ | $TMF_{TC2}(T) = 0$ | $TMF_{TC3}(T) = 0.25$ | $TMF_{TC4}(T) = 0.75$ | $TMF_{TC5}(T) = 0$ |
| T-SP4 +20° C. | $TMF_{TC1}(T) = 0$ | $TMF_{TC2}(T) = 0$ | $TMF_{TC3}(T) = 0$ | $TMF_{TC4}(T) = 1.00$ | $TMF_{TC5}(T) = 0$ |
| EG, T = +23° C. | $TMF_{TC1}(T) = 0$ | $TMF_{TC2}(T) = 0$ | $TMF_{TC3}(T) = 0$ | $TMF_{TC4}(T) = 0.85$ | $TMF_{TC5}(T) = 0.15$ |
| EG, T = +25° C. | $TMF_{TC1}(T) = 0$ | $TMF_{TC2}(T) = 0$ | $TMF_{TC3}(T) = 0$ | $TMF_{TC4}(T) = 0.75$ | $TMF_{TC5}(T) = 0.25$ |
| EG, T = +30° C. | $TMF_{TC1}(T) = 0$ | $TMF_{TC2}(T) = 0$ | $TMF_{TC3}(T) = 0$ | $TMF_{TC4}(T) = 0.50$ | $TMF_{TC5}(T) = 0.50$ |
| EG, T = +35° C. | $TMF_{TC1}(T) = 0$ | $TMF_{TC2}(T) = 0$ | $TMF_{TC3}(T) = 0$ | $TMF_{TC4}(T) = 0.25$ | $TMF_{TC5}(T) = 0.75$ |
| T-SP5 +40° C. | $TMF_{TC1}(T) = 0$ | $TMF_{TC2}(T) = 0$ | $TMF_{TC3}(T) = 0$ | $TMF_{TC4}(T) = 0$ | $TMF_{TC5}(T) = 1.00$ |

Table 1 also reflects further examples of operation of TMF 315 as the controller(s) receive and convert TDS 240, which TDS 240 represents various temperatures of battery(ies) 175. Table 1 shows additional aspects of TDS 240 conversion, and generation by TMF 315 of the various TF and DF and other components of the ultimately generated TCS 245. Table 1 also depicts resultant TMF-MDs 330 as depicted graphically in part in FIG. 3, and according to the various additional examples described herein.

Although not reflected in the figures, those knowledgeable in the field of technology should be able to appreciate that the MF-TC(n) categories of TMF 315 of "not very low" may be used to represent one or more combined categories 320 of "low", "zero", "high", and/or "very high". Similarly, "not low" may be used to represent in combination one or more of "very low", "zero", "high", and/or "very high". As may be apparent by analogy, "not zero", "not high" and/or "not very high", may be employed to respectively represent in combination each or all of the others categories 320 by this method of boolean negation.

The controller(s) also incorporate and/or are configured with and/or as DMF 350 configured to generate the DF from a rate of change of and/or differential of TDS 240 with respect to time. DMF 350 also incorporates rate categories (MF-RCs) 355, which each is calibrated to overlappingly span one of predetermined and/or calculated change rate set points (CR-SPs) 360. Here too, even though this example illustration includes three MF-RCs 355 overlappingly spanning three corresponding CR-SPs 360, the number, configuration, and calibration of such MF-RCs 355 and CR-SPs 360 are adjustable for various applications, and a one to one correspondence between the MF-RCs 355 and CR-SPs 360 is not required.

DMF 350 is shown, for purposes of example but not limitation, to have MF-RCs 355 or MF-RC(j) as "j" is iterated from 1 to "n," where in this example j=3, to include MF-RC1 category "low", MF-RC2 category "medium", and MF-RC3 category "high".

Although not reflected in the figures, those knowledgeable in the field of technology should be able to appreciate that the MF-RC(n) a boolean negation category 355 of "not zero" may be used, and adjusted to be overlapping arranged as discussed elsewhere herein, to represent in combination one or more of "medium" and/or "high". Similarly, "not medium" may be used to represent in combination one or more of "zero", and/or "high", and "not high" may be utilized to represent in combination one or more of "zero" and/or "medium". These optionally preferred category arrangements may be useful in certain applications to further improve real-time response, and to lessen processing and memory resource requirements for DMF 350.

These MF-RC categories 355 are overlappingly, respectively centered on CR-SPs 360 that include, for another exemplary illustration, CR-SP1 of zero degrees Celsius per second (° C./s), CR-SP2 of 0.15° C./s, and CR-SP3 of 0.30° C./s. For purposes of also adjusting and/or improving real-time response, and reducing the need for processing and memory resources of and for functions 385, 390, and collapsing certain test conditions or rows into a single test condition/row, a category of "not high", "not medium", and/or "not zero" can be utilized. In this further example, "not high" may be used to represent in combination the other categories, such as "zero" and/or "medium". Also, "not medium", can represent "high" and/or "zero", and/or "not zero" may be utilized to represent "medium" and/or "high", and combinations thereof.

During conversion of the rate of change of TDS 240 by DMF 350, concurrently with operation of TMF 315, the controller(s) generate(s) and/or establish(es) rate of change or change rate membership degrees (DMF-MDs) 365, which correspond to the change rate of and/or differentiated TDS 240, according to and as a function of MF-RCs 355 and CR-SPs 360. In an exemplary arrangement, and with reference now also to Table 2, DMF 350 is configured to receive and convert a change rate or differential signal TDS 240, such as dT 370 (FIG. 3).

In a continuing example, dT 370 depicts a detected change rate of battery temperature via TDS 240, of about 0.20° C./s. The controller(s) via DMF 350 detect the 0.20 degrees ° C./s dT 370 to be in overlapping MF-RC categories 355 of both MF-RC2 (medium) and MF-RC3 (high). Consequently, for additional illustration purposes, DMF 350 generates respective DMF-MD 375 of 0.60 for MF-RC2 category "medium" and overlapping TMF-MD 380 of 0.40 for MF-RC3 category "high".

TABLE 2

EXAMPLE MF DIFFERENTIAL FACTOR, TD SIGNAL CONVERSIONS

| Battery Temp. Change Rate Set Point CR-SP(i) | MEMBERSHIP FUNCTION CATEGORIES (MF-RC(i)) | | |
|---|---|---|---|
| | Zero MF-RC1 | Medium MF-RC2 | High MF-RC3 |
| CR-SP0 dT 0° C./s | $DMF_{RC1}(T) = 1.00$ | $DMF_{RC2}(T) = 0$ | $DMF_{RC3}(T) = 0$ |
| EG, dT = 0.04° C./s | $DMF_{RC1}(T) = 0.75$ | $DMF_{RC2}(T) = 0.25$ | $DMF_{RC3}(T) = 0$ |
| EG, dT = 0.08° C./s | $DMF_{RC1}(T) = 0.50$ | $DMF_{RC2}(T) = 0.50$ | $DMF_{RC3}(T) = 0$ |
| EG, dT = 0.12° C./s | $DMF_{RC1}(T) = 0.25$ | $DMF_{RC2}(T) = 0.75$ | $DMF_{RC3}(T) = 0$ |
| CR-SP1 dT 0.15° C./s | $DMF_{RC1}(T) = 0$ | $DMF_{RC2}(T) = 1.00$ | $DMF_{RC3}(T) = 0$ |
| EG, dT = 0.18° C./s | $DMF_{RC1}(T) = 0$ | $DMF_{RC2}(T) = 0.75$ | $DMF_{RC3}(T) = 0.25$ |
| EG, dT = 0.20° C./s | $DMF_{RC1}(T) = 0$ | $DMF_{RC2}(T) = 0.60$ | $DMF_{RC3}(T) = 0.40$ |
| EG, dT = 0.22° C./s | $DMF_{RC1}(T) = 0$ | $DMF_{RC2}(T) = 0.50$ | $DMF_{RC3}(T) = 0.50$ |
| EG, dT = 0.26° C./s | $DMF_{RC1}(T) = 0$ | $DMF_{RC2}(T) = 0.25$ | $DMF_{RC3}(T) = 0.75$ |
| CR-SP2 dT 0.3° C./s | $DMF_{RC1}(T) = 0$ | $DMF_{RC2}(T) = 0$ | $DMF_{RC3}(T) = 1.00$ |

Table 2 also depicts further exemplary operational results of DMF 350, as the controller(s) receive and convert TDS 240. Table 2 further illustrates various rates of change, differentials "dT", and/or change rates of temperatures of battery(ies) 175, and shows various components of the ultimately generated TCS 245, which correspond to resultant DMF-MDs 365 as depicted in FIG. 3, and the various examples described herein.

TMF 315 and DMF 350 further generate a TCS calibration factor (TCF) 385 according to MF-TCs 320 and MF-RCs 355, which TCF 385 is also depicted in FIG. 3, for purposes of further example. TMF 315 and DMF 350 then generate TF and DF and the TMF-MDs 330, the DMF-MDs 365, and generated TCF 385, 390, which are then utilized to generate TCS 245 as may be understood with continuing reference according to FIG. 3, Table 2, and Equation 1. Also in FIG. 3, as with other functions and representations discussed elsewhere herein, a boolean negation test condition or function rule of "not high" is used to represent an MF-RC(n) of either "zero" and/or "medium", such that extra test conditions or rules in functions 385, 390 are not needed and are collapsed into a single test condition or rule if appropriate and desired for various applications. The generated TCS 245 may then be utilized to control the convective fluid flow rate and battery temperature, by in turn generating the contemplated PWM control and speed signals that respectively adjusts operation of valves 270, 275, 285, 287, speed of pumps 290, and the resultant convective fluid flow rate, and the performance of heater 170.

With continuing reference to FIG. 3 and Equation 1, it may be understood that controller(s) are configured with and/or as TMF 315 and DMF 350, and are further configured to control the performance of heater 170 by generating TCS 245 to be heating signal (HS) 245. In this arrangement where heating of battery(ies) 175 may be required, performance of heater 170 is controlled by TCS 245 as HS 245, and is also contemplated to generate a different heating signal calibration factor (HS TCF) 390 (FIG. 3) according to MF-TCs 320 and MF-RCs 355.

As with prior arrangements, TMF 315 and DMF 350 also then generate TF, DF, TMF-MDs 330, DMF-MDs 365, and generated HS TCF 390, which are then utilized to generate TCS 245 as HS 245, which should be understood in connection with the other examples and configurations described herein. Also, with respect to this HS 245 configuration and example, the HS may also be the contemplated PWM signal, which that may be calibrated to have a switching frequency and duty cycle tuned to have the improved precision and resolution, and to be compatible for use with heater 170 and related components.

In each of these exemplary configurations, TCS 245 may be generated as the smoothed, calibrated PWM pump speed signal 245. In view of the preceding examples, PSS 245 would be generated by TMF 315 and DMF 350 of the controllers according to Equation 1, and now also in view of Equation 5, which includes the examples of TDS 240 with the detected temperature of 23° C. and detected change rate, dT 370 of 0.20° C./s.

$$PSS = \frac{\sum_{i=1}^{MF\text{-}RC3} \sum_{j=1}^{MF\text{-}TC5} (TCF_{i,j} \times TMF_j(23° \text{ C.}) \times DMF_i(0.20))}{\sum_{i=1}^{MF\text{-}RC3} \sum_{j=1}^{MF\text{-}TC5} (TMF_j(23° \text{ C.}) \times DMF_i(0.20))} \quad \text{EQUATION 4}$$

The controller(s) and TMF 315 and DMF 350 continue generating PSS 245 as depicted in part in Equation 5, which illustrates the internal operation of the controllers.

$$PSS = \frac{\begin{aligned}&(SCF_{2,4} \times TMF_4 \times DMF_2) + \\ &(SCF_{2,5} \times TMF_5 \times DMF_2) + \\ &(SCF_{3,4} \times TMF_4 \times DMF_3) + \\ &(SCF_{3,5} \times TMF_5 \times DMF_3)\end{aligned}}{\begin{aligned}&(TMF_4 \times DMF_2) + (TMF_5 \times DMF_2) + \\ &(TMF_4 \times DMF_3) + (TMF_5 \times DMF_3)\end{aligned}} \quad \text{EQUATION 5}$$

The arithmetic of Equations 4 and 5 is further illustrated in Equation 6, and according to Tables 1 and 2, and the TMF-MDs 330 and DMF-MDs 365 of FIG. 3.

$$PSS \approx \frac{\begin{aligned}&(0.40*0.85*0.60) + (0.60*0.15*0.60) + \\ &(0.80*0.85*0.40) + (1.00*0.15*0.40)\end{aligned}}{\begin{aligned}&(0.85*0.60) + (0.15*0.60) + \\ &(0.85*0.40) + (0.15*0.40)\end{aligned}} \quad \text{EQUATION 6}$$

Equation 7 depicts the arithmetic reduction of Equation 6, and the resultant, generated, calibrated, smoothed PWM PSS 245 of Equations 4, 5, and 6, which can be utilized to adjust the temperature of battery(ies) 175, and to control the speed of pumps 290, the operation of valves 270, 275, 285, 287, and the convective fluid flow rate, and/or the performance of heater 170.

$$PSS \approx \frac{0.59}{1.00} = 0.59, \text{ For } T = 23° \text{ C. and } dT = 0.08° \text{ C./s} \quad \text{EQUATION 7}$$

Figure 4:
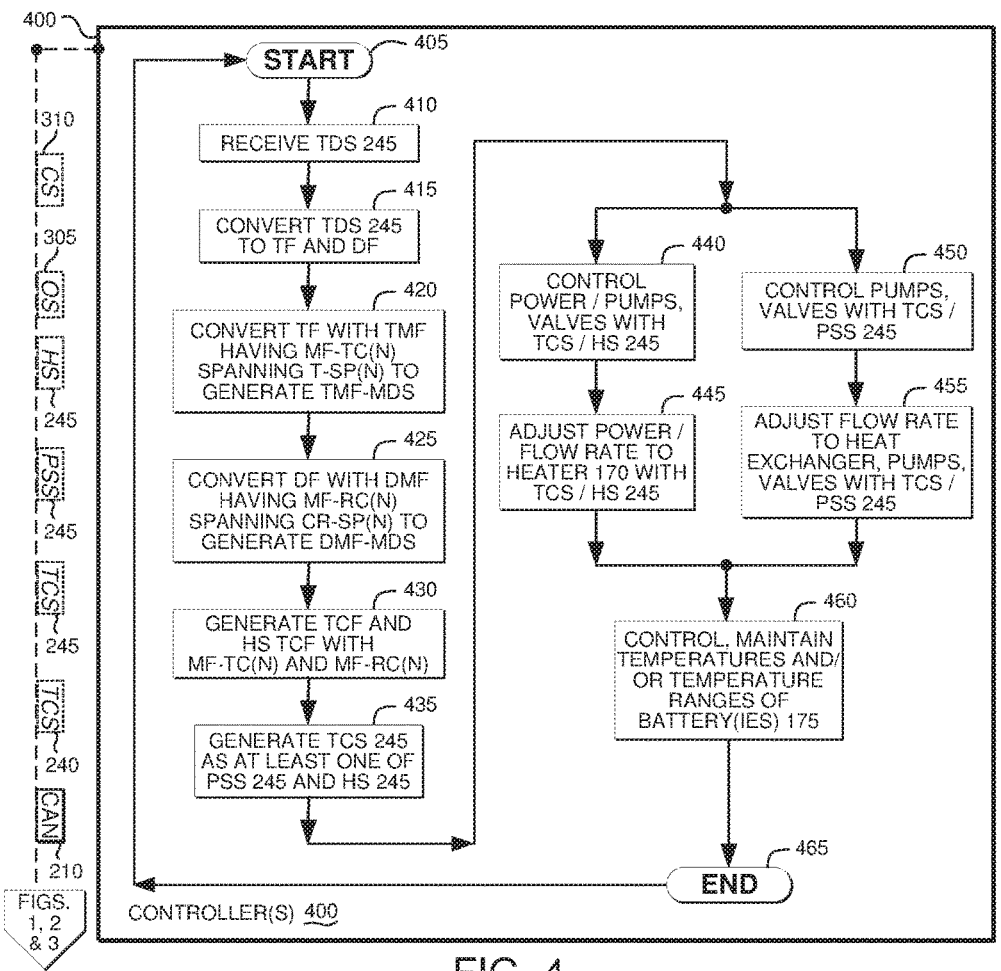
FIG. 4 depicts other aspects of the vehicle systems and methods of the preceding figures and describes various additional capabilities of the contemplated vehicle or vehicles and other operational capabilities of the disclosure.

With continuing reference to the various figures and now also to FIG. 4, the disclosure includes methods of operation of HEV 100 according to each of the configurations, arrangements, variations, and modifications described elsewhere herein. In another exemplary arrangement, the disclosure as further illustrated in FIG. 4 includes method 400 starting at step 405 and configured with one or more of the controllers and TMS 230, controlling and maintaining a temperature and/or temperature ranges of battery(ies) 175 and/or heater(s) 170, in response to battery temperature and differential signals (TDS) 240 at step 410.

At step 415, method 400 includes converting TDS 240 to temperature factor TF and differential factor DF as already described. TMF 315 at step 420 converts TF, utilizing MF-TC(n)s 320, which overlappingly span respective T-SP (n)s 325, and generates TMF-MDs 330 corresponding to the temperature signal 245. Similarly, DMF 350 at step 425 converts DF, utilizing MF-RC(n)s 355 that overlappingly span CR-SP(n)s 360, and generates DMF-MDs 365 that correspond to the differential signal DF. The method at step 430 further generates TCF 385 and or HS TCF 390 with MF-TC(n) 320 and MF-RC(n) 355.

TCS 245 is generated by the controller(s) of TMS 230 and the method of operation at step 435, by the TMF 315 and DMF 350 from a combination of the generated TCF 385, HS TCF 390, TMF-MDs 330, DMF-MDs 365, and the temperature and differential factors. The method 400 generates at step 435 as smoothed, generated TCS 245 that may be generated as at least one of pulse-width-modulated (PWM) pump speed (PSS) 245 and/or heating signals (HS) 245. TCS, PSS, and/or HS 245 are utilized at steps 440 and 445 to control power and/or pumps 290 and/or valves 270, 275, 285, 287, to adjust flow rate of the convective fluid respectively proximate to heat exchanger 195 and/or power to and/or performance of heater(s) 170.

Steps 450 and 455 of method 400 further utilize TCS, PSS, and/or HS 245 to control pumps 290 and/or valves 270, 275, 285, 287, to adjust flow rate of the convective fluid respectively proximate to heat exchanger 195, pumps 290, valves 270, 275, 285, 287, and/or to and through other components such as the refrigerant chiller 190 and radiator 265. The controller(s) of method 400 at step 460 thereby control, maintain, and/or adjust the temperature and/or temperature ranges of battery(ies) 170 and/or heat exchanger(s) 195, and/or other components of HEV 100. At step 465 the method ends and passes control back to start at step 405 where the method continues to control temperature and ranges thereof.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A vehicle, comprising:
   a controller, coupled to a pump and valves that control a flow rate of a convective fluid proximate a battery, configured to, in response to battery temperature and differential signals,
      adjust the flow rate to maintain a battery temperature range by controlling the pump and valves with a temperature control signal (TCS) generated by a fuzzy logic temperature membership function and a fuzzy logic differential membership function from the battery temperature and differential signals respectively; and
   a thermal management system (TMS) incorporating the pump and convective fluid, and further including a heater and a heat exchanger proximate the battery and one or more of the valves in communication with the pump to control the convective fluid flow rate between at least one of the heat exchanger and a chiller and a radiator, the controller further configured to, in response to battery temperature and differential signals (TDS), adjust with the TCS, the heater and the pump and one or more valves to control the flow rate through the heat exchanger, chiller, and radiator, to maintain the battery temperature range.

2. The vehicle according to claim 1, comprising:
   the controller further configured to:
      convert the TDS with the fuzzy logic temperature and differential membership functions to generate the TCS as one or more of a calibrated, smoothed pulse-width-modulated (PWM) speed signal (PSS) and a PWM heating signal (HS); and
      adjust at least one of the flow rate and the heater according to the PSS and HS to maintain the battery temperature range.

3. The vehicle according to claim 1, comprising:
   the controller further configured:
      with the fuzzy logic temperature membership function (TMF) responsive to and configured to convert the battery temperature signal to a temperature factor of the TCS;
      with the TMF including temperature categories (MF-TCs) that each:
         overlappingly span predetermined temperature set points (T-SPs),
         generate membership degrees (TMF-MDs) corresponding to the battery temperature signal,
      to generate a TCS calibration factor (TCF); and
      to generate the temperature factor by the TMF according to a combination of the TMF-MDs and generated TCF.

4. The vehicle according to claim 1, comprising:
   the controller further configured:
      with the fuzzy logic differential membership function (DMF) responsive to and configured to convert the battery differential signal to a differential factor of the TCS;
      with the DMF to include rate categories (MF-RCs) that each:
         overlappingly span change rate set points (CR-SPs),
         generate membership degrees (DMF-MDs) corresponding to the battery differential signal,
      to generate a TCS calibration factor (TCF); and
      to generate the differential factor by the DMF according to a combination of the DMF-MDs and generated TCF.

5. The vehicle according to claim 1, comprising:
   the controller further configured to:
      convert the temperature and differential signals (TDS) to the TCS to be smoothed and calibrated and to include temperature and differential factors and including:
         the fuzzy logic temperature membership function (TMF) responsive to and configured to convert the battery temperature signal to the temperature factor, and including temperature categories (TCs) that each generate membership degrees (TMF-MDs) corresponding to the battery temperature signal, and
         the fuzzy logic differential membership function (DMF) responsive to and configured to convert the battery differential signal to the differential factor, and including rate categories (RCs) that each generate membership degrees (DMF-MDs) corresponding to the battery differential signal;
      generate a TCS calibration factor (TCF) corresponding to the temperature and rate categories; and
      generate the converted TCS by the TMF and DMF from a combination of the generated TCF, TMF-MDs, DMF-MDs, and the temperature and differential factors.

6. The vehicle according to claim 5, comprising:
   a thermal management system (TMS) incorporating the pump and convective fluid, and further including a heater and a heat exchanger proximate the battery and one or more valves in communication with the pump to control the flow rate to a refrigerant chiller and a radiator; and the controller further configured to:
      convert the TDS with the fuzzy logic temperature and differential membership functions, to a smoothed pulse width modulated (PWM) HS,
      generate the converted PWM heating signal by the TMF and DMF from a combination of the generated TCF, TMF-MDs, DMF-MDs, and the temperature and differential factors; and
      adjust the heater and the one or more valves to control the flow rate through the heat exchanger, chiller, and radiator, to maintain the battery temperature range, according to the PWM HS to maintain the battery temperature range.

7. The vehicle according to claim 1, comprising:
   the controller further configured to:
      convert the signals to the TCS to be smoothed and calibrated and to include temperature and differential factors, and including:
         the fuzzy logic temperature membership function (TMF) responsive to and configured to convert the battery temperature signal to the temperature factor, and including temperature categories (MF-TCs) that each:
            overlappingly span temperature set points (T-SPs), and
            generate membership degrees (TMF-MDs) corresponding to the battery temperature signal, and the fuzzy logic differential membership function (DMF) responsive to and configured to convert the battery differential signal to the differential factor, and including rate categories (MF-RCs) that each:
  overlappingly span change rate set points (CR-SPs), and
  generate membership degrees (DMF-MDs) corresponding to the battery differential signal;
generate a TCS calibration factor (TCF) corresponding to the temperature and rate categories; and
generate the converted TCS by the DMF and TMF from a combination of the generated TCF, TMF-MDs, DMF-MDs, and the temperature and differential factors.

8. The vehicle according to claim 7, comprising:
a thermal management system (TMS) incorporating the pump and convective fluid, and further including a heater and a heat exchanger proximate the battery and one or more valves in communication with the pump to control the flow rate to a refrigerant chiller and a radiator; and
the controller further configured to:
  convert the temperature and differential signals (TDS) with the fuzzy logic temperature and differential membership functions to a smoothed, calibrated pulse width modulated (PWM) HS,
  generate the converted PWM HS by the TMF and DMF from a combination of the generated TCF, TMF-MDs, DMF-MDs, and the temperature and differential factors; and
  adjust the heater and the one or more valves to control the flow rate through the heat exchanger, chiller, and radiator, to maintain the battery temperature range, according to the PWM HS to maintain the battery temperature range.

9. A vehicle, comprising:
a thermal management system incorporating a heater, and pump and valves controlling a flow rate of a convective fluid about a battery, refrigerant chiller, and radiator; and
a controller configured to, in response to battery temperature and differential signals:
  adjust the flow rate to maintain a battery temperature range according to a control signal generated with a fuzzy logic temperature membership function and a fuzzy logic differential membership function the temperature and differential signals
the thermal management system (TMS) including a heat exchanger proximate the battery; and
the controller further configured to:
  convert the temperature and differential signals (TDS) to the temperature control signal (TCS) as calibrated, smoothed, pulse-width-modulated (PWM) pump seed and PWM heating signals (PSS, HS),
  adjust the heater with the smoothed PWM HS, and
  adjust the flow rate by the pump and valves with the PWM PSS to control the flow rate through the heat exchanger, chiller, and radiator,
  to maintain the battery temperature range.

10. The vehicle according to claim 9, comprising:
the controller further configured:
  with the fuzzy logic temperature membership function (TMF) responsive to and configured to convert the battery temperature signal to a temperature factor of the smoothed PWM PSS and HS;
  with the TMF including temperature categories (MF-TCs) that each:
    overlappingly span predetermined temperature set points (T-SPs),
    generate membership degrees (TMF-MDs) corresponding to the battery temperature signal,
  to generate a TCS calibration factor (TCF); and
  to generate the temperature factor by the TMF according to a combination of the TMF-MDs and generated TCF.

11. The vehicle according to claim 9, comprising:
the controller further configured:
  with the fuzzy logic differential membership function (DMF) responsive to and configured to convert the battery differential signal to a differential factor of the smoothed PWM PSS and HS;
  with the DMF to include rate categories (MF-RCs) that each:
    overlappingly span change rate set points (CR-SPs),
    generate membership degrees (DMF-MDs) corresponding to the battery differential signal,
  to generate a TCS calibration factor (TCF); and
  to generate the differential factor by the DMF according to a combination of the DMF-MDs and generated TCF.

12. The vehicle according to claim 9, comprising:
the controller further configured to:
  convert the TDS to the smoothed PWM PSS and HS to include temperature and differential factors and including:
    the fuzzy logic temperature membership function (TMF) responsive to and configured to convert the battery temperature signal to the temperature factor, and including temperature categories (TCs) that each generate membership degrees (TMF-MDs) corresponding to the battery temperature signal, and
    the fuzzy logic differential membership function (DMF) responsive to and configured to convert the battery differential signal to the differential factor, and including rate categories (RCs) that each generate membership degrees (DMF-MDs) corresponding to the battery differential signal;
  generate a TCS calibration factor (TCF) corresponding to the temperature and rate categories; and
  generate the converted PWM PSS and HS respectively by the TMF and DMF from a combination of the generated TCF, TMF-MDs, DMF-MDs, and the temperature and differential factors.

13. The vehicle according to claim 9, comprising:
the controller further configured to:
convert the TDS to the smoothed, calibrated PWM PSS and HS having temperature and differential factors, and including:
the fuzzy logic temperature membership function (TMF) responsive to and configured to convert the battery temperature signal to the temperature factor, and including temperature categories (MF-TCs) that each:
  overlappingly span temperature set points (T-SPs), and
  generate membership degrees (TMF-MDs) corresponding to the battery temperature signal, and
the fuzzy logic differential membership function (DMF) responsive to and configured to convert the battery differential signal to the differential factor, and including rate categories (MF-RCs) that each:
  overlappingly span change rate set points (CR-SPs), generate membership degrees (DMF-MDs) corresponding to the battery differential signal;
generate a TCS calibration factor (TCF) corresponding to the temperature and rate categories; and
generate the converted TCS by the DMF and TMF from a combination of the generated TCF, TMF-MDs, DMF-MDs, and the temperature and differential factors.

14. A method of controlling a vehicle, comprising:
by a controller:
commanding, in response to battery temperature and differential signals, a pump and valves configured to control a flow rate of a convective fluid proximate a battery,
adjusting the flow rate to maintain a battery temperature range by controlling the pump and valves with a temperature control signal generated with a fuzzy logic temperature membership function and a fuzzy logic differential membership function from the temperature and differential signals,
commanding at least one of, by a thermal management system (TMS) incorporating the pump, valves, and convective fluid and further including a chiller and radiator, and a heater and a heat exchanger proximate the battery,
the pump with the temperature control signal (TCS) to control the flow rate to through the chiller, heat exchanger, and radiator, and
the heater with the TCS,
to maintain the battery temperature range.

15. The method according to claim 14, further comprising:
by the controller:
converting the temperature and differential signals (TDS) to the TCS as calibrated, smoothed pulse-width-modulated (PWM) pump speed and heating signals (PSS, HS),
adjusting the heater with the smoothed PWM HS, and
adjusting the flow rate by the pump and valves with the PWM PSS to control the flow rate through the heat exchanger, chiller, and radiator,
to maintain the battery temperature range.

16. The method according to claim 15, further comprising:
by the controller:
converting the TDS to the calibrated, smoothed PWM PSS and HS to include temperature and differential factors and including:
the fuzzy logic temperature membership function (TMF) responsive to and configured to convert the battery temperature signal to the temperature factor, and including temperature categories (TCs) that each generate membership degrees (TMF-MDs) corresponding to the battery temperature signal, and
the fuzzy logic differential membership function (DMF) responsive to and configured to convert the battery differential signal to the differential factor, and including rate categories (RCs) that each generate membership degrees (DMF-MDs) corresponding to the battery differential signal;
generating a TCS calibration factor (TCF) corresponding to the temperature and rate categories; and
generating the converted PWM PSS and HS respectively by the TMF and DMF from a combination of the generated TCF, TMF-MDs, DMF-MDs, and the temperature and differential factors.

17. The method according to claim 15, further comprising:
by the controller:
converting the TDS to the calibrated, smoothed PWM PSS and HS each having temperature and differential factors, and including:
the fuzzy logic temperature membership function (TMF) responsive to and configured to convert the battery temperature signal to the temperature factor, and including temperature categories (MF-TCs) that each:
overlappingly span temperature set points (T-SPs), and
generate membership degrees (TMF-MDs) corresponding to the battery temperature signal, and
the fuzzy logic differential membership function (DMF) responsive to and configured to convert the battery differential signal to the differential factor, and including rate categories (MF-RCs) that each:
overlappingly span change rate set points (CR-SPs), and
generate membership degrees (DMF-MDs) corresponding to the battery differential signal;
generating a TCS calibration factor (TCF) corresponding to the temperature and rate categories; and
generating the converted TCS by the DMF and TMF from a combination of the generated TCF, TMF-MDs, DMF-MDs, and the temperature and differential factors.

* * * * *